(12) United States Patent
Noller et al.

(10) Patent No.: US 10,407,594 B2
(45) Date of Patent: Sep. 10, 2019

(54) CHEMICAL MECHANICAL POLISHING (CMP) COMPOSITION COMPRISING A POLYMERIC POLYAMINE

(75) Inventors: Bastian Marten Noller, Lorsch (DE); Yuzhuo Li, Mannheim (DE); Diana Franz, Schifferstadt (DE); Kenneth Rushing, Paw paw, MI (US); Michael Lauter, Mannheim (DE); Daniel Kwo-Hung Shen, Junghe (TW); Yongqing Lan, Potsdam, NY (US); Zhenyu Bao, Potsdam, NY (US)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 14/004,689

(22) PCT Filed: Mar. 19, 2012

(86) PCT No.: PCT/IB2012/051292
§ 371 (c)(1),
(2), (4) Date: Sep. 12, 2013

(87) PCT Pub. No.: WO2012/127398
PCT Pub. Date: Sep. 27, 2012

(65) Prior Publication Data
US 2014/0004703 A1    Jan. 2, 2014

Related U.S. Application Data

(60) Provisional application No. 61/466,009, filed on Mar. 22, 2011.

(51) Int. Cl.
*H01L 21/302* (2006.01)
*C03C 25/68* (2006.01)
(Continued)

(52) U.S. Cl.
CPC .............. *C09G 1/02* (2013.01); *C09G 1/16* (2013.01); *H01L 21/30625* (2013.01)

(58) Field of Classification Search
CPC .. C23F 3/06; C23F 3/00; C23F 11/141; C23F 1/26; C09K 3/1463; C09K 3/1409;
(Continued)

(56) References Cited

U.S. PATENT DOCUMENTS 5,876,490 A    3/1999    Ronay
6,312,486 B1   11/2001   Sandhu et al.
(Continued)

FOREIGN PATENT DOCUMENTS

CN    1398944 A    2/2003
CN    1408124 A    4/2003
(Continued)

OTHER PUBLICATIONS

U.S. Appl. No. 14/006,744, filed Sep. 23, 2013, Noller, et al.
(Continued)

*Primary Examiner* — Binh X Tran
*Assistant Examiner* — Christopher Remavege
(74) *Attorney, Agent, or Firm* — Oblon, McClelland, Maier & Neustadt, L.L.P.

(57) ABSTRACT

A chemical-mechanical polishing (CMP) composition comprising (A) inorganic particles, organic particles, or a composite or mixture thereof, (B) a polymeric polyamine or a salt thereof comprising at least one type of pendant group (Y) which comprises at least one moiety (Z), wherein (Z) is a carboxylate (—COOR$^1$), sulfonate (—SO$_3$R$^2$), sulfate (—O—SO$_3$R$^3$), phosphonate (—P(=O)(OR$^4$)(OR$^5$)), phosphate (—O—P(=O)(OR$^6$)(OR$^7$)), carboxylic acid (—COOH), sulfonic acid (—SO$_3$H), sulfuric acid (—O—SO$_3$—), phosphonic acid (—P(=O)(OH)$_2$), phosphoric acid (—O—P(=O)(OH)$_2$) moiety, or their deprotonated forms,
(Continued)

$R^1$ is alkyl, aryl, alkylaryl, or arylalkyl $R^2$ is alkyl, aryl, alkylaryl, or arylalkyl, $R^3$ is alkyl, aryl, alkylaryl, or arylalkyl, $R^4$ is alkyl, aryl, alkylaryl, or arylalkyl, $R^5$ is H, alkyl, aryl, alkylaryl, or arylalkyl, $R^6$ is alkyl, aryl, alkylaryl, or arylalkyl, $R^7$ is H, alkyl, aryl, alkylaryl, or arylalkyl, and (C) an aqueous medium.

12 Claims, 1 Drawing Sheet

(51) Int. Cl.
  *C09G 1/02* (2006.01)
  *C09G 1/16* (2006.01)
  *H01L 21/306* (2006.01)

(58) Field of Classification Search
  CPC ..... C09K 13/00; C09K 13/06; H01L 21/3212; H01L 21/7684; H01L 21/32115; H01L 21/30625; C09G 1/02; C09G 1/04; B24B 37/044; B24B 1/00
  USPC .............. 216/89; 438/693; 252/79.1; 51/298
  See application file for complete search history.

(56) References Cited

U.S. PATENT DOCUMENTS

| | | | |
|---|---|---|---|
| 6,316,365 | B1 | 11/2001 | Wang et al. |
| 6,852,009 | B2 | 2/2005 | Kawase et al. |
| 6,855,267 | B2 | 2/2005 | Lee et al. |
| 7,022,255 | B2 | 4/2006 | Siddiqui et al. |
| 7,582,564 | B2 | 9/2009 | Wang et al. |
| 8,236,695 | B2* | 8/2012 | Liu et al. ................ 438/693 |
| 2002/0043026 | A1 | 4/2002 | Luo et al. |
| 2002/0096659 | A1* | 7/2002 | Sakai et al. ............. 252/79 |
| 2002/0151252 | A1 | 10/2002 | Kawase et al. |
| 2005/0076578 | A1* | 4/2005 | Siddiqui et al. .......... 51/307 |
| 2005/0079718 | A1 | 4/2005 | Siddiqui et al. |
| 2006/0099814 | A1 | 5/2006 | Carter et al. |
| 2006/0226126 | A1* | 10/2006 | Zhou et al. ............... 216/90 |
| 2008/0032911 | A1* | 2/2008 | Becker et al. ............. 510/528 |
| 2008/0148652 | A1* | 6/2008 | Siddiqui ................ C09G 1/02 51/308 |
| 2009/0137124 | A1 | 5/2009 | Carter et al. |
| 2009/0291873 | A1* | 11/2009 | Tamboli ............... C11D 3/2075 510/175 |
| 2010/0319735 | A1* | 12/2010 | Hidaka et al. ............. 134/34 |
| 2011/0250754 | A1* | 10/2011 | Hirano et al. ............. 438/693 |
| 2011/0312181 | A1* | 12/2011 | Shi ........................ 438/693 |
| 2012/0028466 | A1* | 2/2012 | McConnell et al. ........ 438/692 |
| 2012/0058643 | A1 | 3/2012 | Raman et al. |
| 2012/0322264 | A1 | 12/2012 | Raman et al. |

FOREIGN PATENT DOCUMENTS

| | | |
|---|---|---|
| EP | 1 229 094 A2 | 8/2002 |
| EP | 1 702 015 B1 | 9/2009 |
| JP | 2009-148683 A | 7/2009 |
| KR | 10-0855474 | 8/2008 |
| WO | WO 2004/063301 A1 | 7/2004 |
| WO | WO 2006/052433 A2 | 5/2006 |

OTHER PUBLICATIONS

U.S. Appl. No. 13/318,911, filed Nov. 4, 2011, US2012/0058643 A1, Raman, et al.
U.S. Appl. No. 13/580,039, filed Aug. 20, 2012, US2012/0322264 A1, Raman, et al.
International Search Report dated Jul. 19, 2012, in PCT/IB2012/051292, filed Mar. 19, 2012.
European Search Report dated May 21, 2012, in Patent Application No. EP 12 16 0029.
European Search Report dated Sep. 22, 2011, in Patent Application No. EP 11 16 4012.
U.S. Appl. No. 14/362,510, filed Jun. 3, 2014, Raman, et al.

* cited by examiner

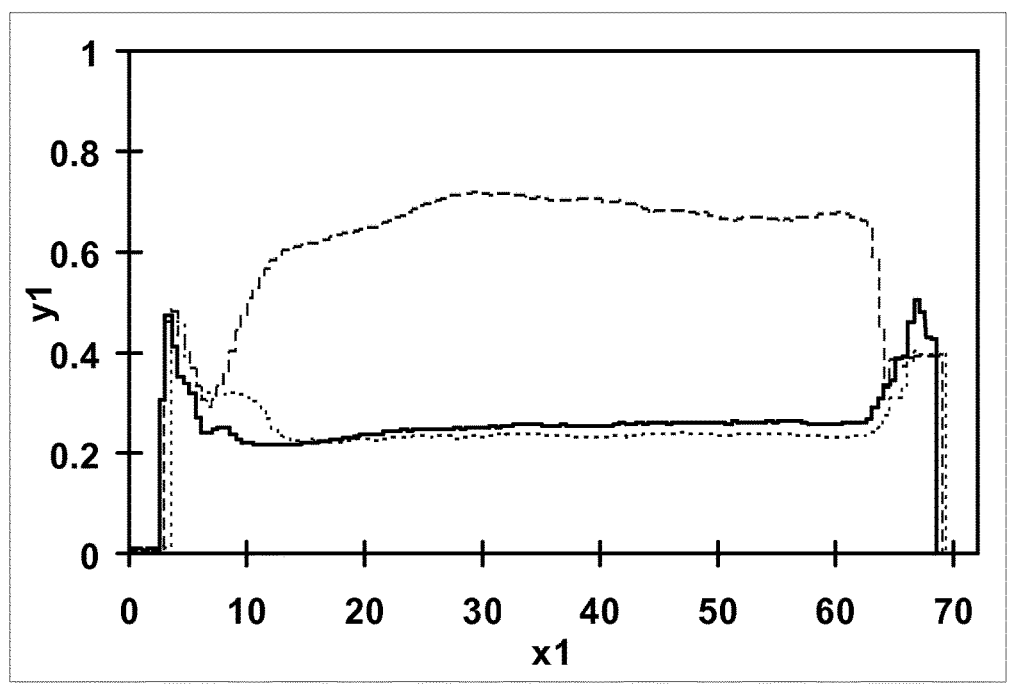

CHEMICAL MECHANICAL POLISHING (CMP) COMPOSITION COMPRISING A POLYMERIC POLYAMINE

CROSS REFERENCE TO RELATED APPLICATIONS

The present application is a 35 U.S.C. § 371 national stage patent application of International patent application PCT/IB2012/051292, filed on Mar. 19, 2012, published as WO/2012/127398 on Sep. 27, 2012, the text of which is incorporated by reference, and claims the benefit of the filing date of US provisional application no. 61/466,009, filed on Mar. 22, 2011, the text of which is also incorporated by reference.

DESCRIPTION

This invention essentially relates to a chemical mechanical polishing (CMP) composition and its use in polishing substrates of the semiconductor industry. The CMP composition according to the invention comprises a specific polymeric polyamine or a salt thereof and shows an improved polishing performance.

In the semiconductor industry, chemical mechanical polishing (abbreviated as CMP) is a well-known technology applied in fabricating advanced photonic, microelectromechanical, and microelectronic materials and devices, such as semiconductor wafers.

During the fabrication of materials and devices used in the semiconductor industry, CMP is employed to planarize metal and/or oxide surfaces. CMP utilizes the interplay of chemical and mechanical action to achieve the planarity of the to-be-polished surfaces. Chemical action is provided by a chemical composition, also referred to as CMP composition or CMP slurry. Mechanical action is usually carried out by a polishing pad which is typically pressed onto the to-be-polished surface and mounted on a moving platen. The movement of the platen is usually linear, rotational or orbital.

In a typical CMP process step, a rotating wafer holder brings the to-be-polished wafer in contact with a polishing pad. The CMP composition is usually applied between the to-be-polished wafer and the polishing pad.

In the state of the art, CMP compositions comprising a polymeric polyamine are known and described, for instance, in the following references.

U.S. Pat. No. 5,876,490 discloses a CMP composition comprising abrasive particles and a polyelectrolyte having ionic moieties with a charge that differs from that of the abrasive particles. Said polyelectrolyte can be for example poly(vinylamine), poly(ethylenimine), poly(4-vinyl pyridine).

U.S. Pat. No. 6,855,267 B2 discloses a CMP slurry comprising an abrasive, a pH controlling agent, choline chloride and polyethylene imine having a molecular structure of [—$CH_2CH_3N(CH_2CH_2NH_2)$—]$_x$[—$CH_2CH_2$ NH—]$_y$, where x and y are positive integers.

U.S. Pat. No. 7,022,255 B2 discloses a CMP composition comprising an organometallic-modified abrasive and a nitrogen-containing polymer compound such as polyalkyleneimine, which can be polyethyleneimine, modified polyethyleneimines, including but not limited to polyamidopolyethyleneimine, polypropyleneimine, and higher homologs thereof.

U.S. Pat. No. 7,582,564 B2 discloses a CMP composition comprising an acid based electrolyte system, a chelating agent, a corrosion inhibitor, a basic pH adjusting agent and a passivating polymeric material such as polyethyleneimine.

U.S. Pat. No. 6,312,486 B1 discloses a CMP composition comprising an abrasive, a pH buffering agent, an ion selected from an ion of Group II elements of the Periodic Table, and a chelating agent selected from the group consisting of polycarboxylic acid and salts thereof; polyamines; polyols; polyethers; polyetherdiols; and polyetherdiamines.

KR 10-0855474 B discloses an abrasive, an oxidizing agent, an organic acid, and optionally an insulating layer polishing inhibitor which is selected from the group consisting of polyethyleneimine, polypropyleneimine, polybutyleneimine and their mixtures.

One of the objects of the present invention was to provide a CMP composition which shows an improved polishing performance, particularly the combination of high material removal rate (MRR), low hot static etching rates of metal-containing substrate (metal-hSER) and low cold static etching rates of metal-containing substrate (metal-cSER), low hot metal ion static etching rates with regard to metal-containing substrate (metal-hMSER), high ratio of MRR to metal-hSER, high ratio of MRR to metal-cSER, high ratio of MRR to metal-hMSER, and the reduction of erosion and dishing effects. Furthermore, a CMP composition was contemplated which is capable to reduce the friction force during the CMP process. In addition, a further object was to provide a CMP composition which is particularly appropriate and adopted for the CMP of copper-containing layers in a multilevel structure.

Furthermore, a respective CMP process was to be provided.

Accordingly, a CMP composition was found which comprises (A) inorganic particles, organic particles, or a mixture or composite thereof, (B) a polymeric polyamine or a salt thereof comprising at least one type of pendant group (Y) which comprises at least one moiety (Z), wherein (Z) is a carboxylate (—$COOR^1$), sulfonate (—$SO_3R^2$), sulfate (—O—$SO_3R^3$), phosphonate (—P(=O)($OR^4$)($OR^5$)), phosphate (—O—P(=O)($OR^6$)($OR^7$)), carboxylic acid (—COOH), sulfonic acid (—$SO_3H$), sulfuric acid (—O—$SO_3^-$), phosphonic acid (—P(=O)(OH)2), phosphoric acid (—O—P(=O)(OH)$_2$) moiety, or their deprotonated forms, $R^1$, $R^2$, $R^3$, $R^4$, and $R^6$ are independently from each other alkyl, aryl, alkylaryl, or arylalkyl, $R^5$ and $R^7$ are independently from each other H, alkyl, aryl, alkylaryl, or arylalkyl, and (C) an aqueous medium.

In addition, the above-mentioned objects of the invention are achieved by a process for the manufacture of a semiconductor device comprising the polishing of a metal-containing substrate in the presence of said CMP composition.

Moreover, the use of the CMP composition of the invention for polishing substrates which are used in the semiconductor industry has been found, which fulfills the objects of the invention.

Preferred embodiments are explained in the claims and the specification. It is understood that combinations of preferred embodiments are within the scope of the present invention.

A semiconductor device can be manufactured by a process which comprises the CMP of a substrate in the presence of the CMP composition of the invention. Preferably, said process comprises the CMP of a metal-containing substrate, that is a substrate comprising metal in the form of elements, alloys, or compounds such as metal nitrides or oxides. Said process comprises more preferably the CMP of a metal layer of said substrate, most preferably the CMP of a copper layer of said substrate, and for example the CMP of a copper layer of a substrate comprising copper and tantalum.

The CMP composition of the invention is used for polishing any substrate used in the semiconductor industry. This use is referred to as (U1).

Furthermore, the CMP composition of the invention is used for the CMP of a metal-containing substrate, wherein said CMP composition comprises the polymeric polyamine or the salt thereof (B) in a weight concentration (% B) of at least 0.0005 wt. %, and wherein the friction force during the CMP process is reduced by at least 15% compared to reference composition which is identical to said CMP composition but free of (B). This use is referred to as (U2).

With regard to the use (U1) and (U2), said CMP composition is used preferably for polishing a metal-containing substrate, more preferably for polishing a metal layer of a said substrate, most preferably for polishing a copper layer of said substrate, and for example for polishing a copper layer of a substrate comprising copper and tantalum.

The friction force is defined as the coefficient of friction (CoF) which is the ratio of the ratio of friction to normal force. With regard to the use (U2), the friction force during the CMP process is reduced preferably by at least 20%, more preferably by at least 25%, most preferably by at least 30%, for example by at least 40% compared to reference composition which is identical to said CMP composition but free of (B).

(% B) is the weight concentration of (B) based on the total weight of the corresponding composition. wt. % is percent by weight. With regard to the use (U1) and (U2), (% B) is preferably at least 0.0007 wt. %, more preferably at least 0.001 wt. %, most preferably at least 0.003 wt. %, for example at least 0.01 wt. %. With regard to the use (U1) and (U2), (% B) is preferably not more than 3 wt. %, more preferably not more than 1 wt. %, most preferably not more than 0.3 wt. %, for example not more than 0.1 wt. %.

According to the invention, the CMP composition contains inorganic particles, organic particles, or a mixture or composite thereof (A). (A) can be
  of one type of inorganic particles,
  a mixture or composite of different types of inorganic particles,
  of one type of organic particles,
  a mixture or composite of different types of organic particles, or
  a mixture or composite of one or more types of inorganic particles and one or more types of organic particles.

A composite is a composite particle comprising two or more types of particles in such a way that they are mechanically, chemically or in another way bound to each other. An example for a composite is a core-shell particle comprising one type of particle in the outer sphere (shell) and another type of particle in the inner sphere (core).

Generally, the particles (A) can be contained in varying amounts. Preferably, the amount of (A) is not more than 10 wt. %, more preferably not more than 4 wt. %, most preferably not more than 2 wt. %, for example not more than 1 wt. %, based on the total weight of the corresponding composition. Preferably, the amount of (A) is at least 0.005 wt. %, more preferably at least 0.01 wt. %, most preferably at least 0.05 wt. %, for example at least 0.1 wt. %, based on the total weight of the corresponding composition.

Generally, the particles (A) can be contained in varying particle size distributions. The particle size distributions of the particles (A) can be monomodal or multimodal. In case of multimodal particle size distributions, bimodal is often preferred. In order to have an easily reproducible property profile and easily reproducible conditions during the CMP process of the invention, a monomodal particle size distribution is preferred for (A). It is most preferred for (A) to have a monomodal particle size distribution.

The mean particle size of the particles (A) can vary within a wide range. The mean particle size is the $d_{50}$ value of the particle size distribution of (A) in the aqueous medium (C) and can be determined using dynamic light scattering techniques. Then, the $d_{50}$ values are calculated under the assumption that particles are essentially spherical. The width of the mean particle size distribution is the distance (given in units of the x-axis) between the two intersection points, where the particle size distribution curve crosses the 50% height of the relative particle counts, wherein the height of the maximal particle counts is standardized as 100% height.

Preferably, the mean particle size of the particles (A) is in the range of from 5 to 500 nm, more preferably in the range of from 5 to 250 nm, most preferably in the range of from 50 to 150 nm, and in particular in the range of from 90 to 130 nm, as measured with dynamic light scattering techniques using instruments such as High Performance Particle Sizer (HPPS) from Malvern Instruments, Ltd. or Horiba LB550.

The particles (A) can be of various shapes. Thereby, the particles (A) may be of one or essentially only one type of shape. However, it is also possible that the particles (A) have different shapes. For instance, two types of differently shaped particles (A) may be present. For example, (A) can have the shape of cubes, cubes with chamfered edges, octahedrons, icosahedrons, nodules or spheres with or without protrusions or indentations. Preferably, they are spherical with no or only very few protrusions or indentations.

The chemical nature of particles (A) is not particularly limited. (A) may be of the same chemical nature or a mixture or composite of particles of different chemical nature. As a rule, particles (A) of the same chemical nature are preferred. Generally, (A) can be
  inorganic particles such as a metal, a metal oxide or carbide, including a metalloid, a metalloid oxide or carbide, or
  organic particles such as polymer particles,
  a mixture or composite of inorganic and organic particles.

Particles (A) are preferably inorganic particles. Among them, oxides and carbides of metals or metalloids are preferred. More preferably, particles (A) are alumina, ceria, copper oxide, iron oxide, nickel oxide, manganese oxide, silica, silicon nitride, silicon carbide, tin oxide, titania, titanium carbide, tungsten oxide, yttrium oxide, zirconia, or mixtures or composites thereof. Most preferably, particles (A) are alumina, ceria, silica, titania, zirconia, or mixtures or composites thereof. In particular, (A) are silica. For example, (A) are colloidal silica. Generally, colloidal silica are fine amorphous, nonporous, and typically spherical silica particles.

In another embodiment in which (A) are organic particles, or a mixture or composite of inorganic and organic particles, polymer particles are preferred. Polymer particles can be homo- or copolymers. The latter may for example be block-copolymers, or statistical copolymers. The homo- or copolymers may have various structures, for instance linear, branched, comb-like, dendrimeric, entangled or cross-linked. The polymer particles may be obtained according to the anionic, cationic, controlled radical, free radical mechanism and by the process of suspension or emulsion polymerisation. Preferably, the polymer particles are at least one of the polystyrenes, polyesters, alkyd resins, polyurethanes, polylactones, polycarbonates, poylacrylates, polymethacrylates, polyethers, poly(N-alkylacryleamide)s, poly(methyl vinyl ether)s, or copolymers comprising at least one of vinylaromatic compounds, acrylates, methacrylates, maleic anhydride acrylamides, methacrylamides, acrylic acid, or methacrylic acid as monomeric units, or mixtures or composites thereof. Among them, polymer particles with a cross-linked structure are preferred.

According to the invention, the CMP composition comprises (B) a polymeric polyamine or a salt thereof comprising at least one type of pendant group (Y) which comprises at least one moiety (Z), wherein (Z) is a carboxylate ($-COOR^1$), sulfonate ($-SO_3R^2$), sulfate ($-O-SO_3R^3$), phosphonate ($-P(=O)(OR^4)(OR^5)$), phosphate ($-O-P(=O)(OR^6)(OR^7)$), carboxylic acid ($-COOH$), sulfonic acid ($-SO_3H$), sulfuric acid ($-O-SO_3^-$), phosphonic acid ($-P(=O)(OH)_2$), phosphoric acid ($-O-P(=O)(OH)_2$) moiety, or their deprotonated forms, $R^1$ is alkyl, aryl, alkylaryl, or arylalkyl
$R^2$ is alkyl, aryl, alkylaryl, or arylalkyl,
$R^3$ is alkyl, aryl, alkylaryl, or arylalkyl,
$R^4$ is alkyl, aryl, alkylaryl, or arylalkyl,
$R^5$ is H, alkyl, aryl, alkylaryl, or arylalkyl,
$R^6$ is alkyl, aryl, alkylaryl, or arylalkyl,
$R^7$ is H, alkyl, aryl, alkylaryl, or arylalkyl.

Generally, (B) can be of one type or a mixture of different types of such polyamines or a salt thereof. Preferably, (B) is one type of such polyamines or a salt thereof. More preferably, (B) is a polyalkyleneimine or a salt thereof. Most preferably, (B) is a polyethyleneimine, a polypropyleneimine, a polybutyleneimine, or a salt thereof. For example, (B) is a polyethyleneimine, or a salt thereof.

In general, (B) can be homopolymers or copolymers. The latter may be alternating, periodic, statistical or block copolymers.

Generally, (B) can be of any polymer structure, for example a linear polymer, a ring polymer, a cross-linked polymer, a branched polymer, a star polymer, a comb polymer, a brush polymer, a dendronized polymer, or a dendrimer etc. Preferably, (B) is an essentially linear polymer. More preferably, (B) is a linear polymer.

In general, (B) can be contained in varying amounts. Preferably, the amount of (B) is not more than 4 wt. %, more preferably not more than 1 wt. %, most preferably not more than 0.2 wt. %, for example not more than 0.04 wt. %, based on the total weight of the corresponding composition. Preferably, the amount of (B) is at least 0.0001 wt. %, more preferably at least 0.0005 wt. %, most preferably at least 0.002 wt. %, for example at least 0.01 wt. %, based on the total weight of the corresponding composition.

Generally, the polyamine or a salt thereof (B) can have different weight average molecular weights. The weight average molecular weight of (B) is preferably at least 1,000, more preferably at least 5,000, most preferably at least 15,000, for example at least 30,000. The weight average molecular weight of (B) is preferably not more than 600,000, more preferably not more than 250,000, most preferably not more than 120,000, for example not more than 70,000. The weight average molecular weight can be determined by standard gel permeation chromatography (GPC) known to the person skilled in the art.

In general, the solubility of (B) in an aqueous medium can vary within a wide range. The solubility of (B) in water at pH 7 at 25° C. under atmospheric pressure is preferably at least 0.1 g/L, more preferably at least 0.5 g/L, most preferably at least 1 g/L, for example at least 4 g/L. Said solubility can be determined by evaporating the solvent and measuring the remaining mass in the saturated solution.

In case (B) is one type or a mixture of different types of salts of such polyamines, these salts preferably comprise cations (M) and such polyamines as anions. Cations (M) can be any cation other than proton (hydrogen cation). Generally, cations (M) can be of the same chemical nature or a mixture of cations of different chemical nature. As a rule, cations (M) of the same chemical nature are preferred. Preferably, cation (M) is a metal cation, an inorganic or organic ammonium cation, a phosphonium cation, a heterocyclic cation, or a homocyclic cation. More preferably, cation (M) is a metal cation, an inorganic or organic ammonium cation. Most preferably, cation (M) is an alkali metal cation, an earth alkali metal cation, or an $NH_4^+$ cation. In particular, cation (M) is an alkali metal cation. For example, cation (M) is an $Na^+$ cation.

A heterocyclic cation is a cationic cyclic compound with two different chemical elements as ring members atoms. A homocyclic cation is a cationic cyclic compound with one chemical element as ring members atoms. An organic ammonium cation is a cationic organic compound containing a positively charged, tetravalent nitrogen atom. An inorganic ammonium cation is a cationic inorganic compound containing a positively charged, tetravalent nitrogen atom.

Generally, (B) can comprise one or more types of pendant groups (Y). (B) comprises preferably 1 to 4 types, more preferably 1 or 2 types, most preferably 2 types of pendant groups (Y).

In general, (B) can comprise pendant groups (Y) in different forms of bonding between (B) and (Y). Preferably, (B) comprises at least one type of (Y) which is covalently bound to the nitrogen atoms on the backbone of (B). More preferably, all types of (Y) comprised in (B) are covalently bound to the nitrogen atoms on the backbone of (B). Most preferably, (B) comprises two types of (Y) which are covalently bound to the nitrogen atoms on the backbone of (B). The backbone of (B) is defined as the main chain of (B), i.e. that chain of (B), to which all other chains, long or short or both, may be regarded as being pendant.

Generally, the percentage (% YN) of pendant groups (Y) comprised in (B) which are covalently bound to the nitrogen atoms on the backbone of (B) can vary between 0% and 100%. Said percentage is referred to as (% YN) and is preferably at least 40%, more preferably at least 60%, most preferably at least 70%, for example at least 80%. (% YN) is preferably not more than 99%, more preferably not more than 97%, most preferably not more than 95%, for example not more than 90%.

In general, the percentage (% NY) of nitrogen atoms on the backbone of (B) which are substituted with pendant group (Y) can vary between 0% and 100%. Said percentage is referred to as (% NY) and is preferably at least 40%, more preferably at least 60%, most preferably at least 70%, for example at least 80%. (% NY) is preferably not more than 99%, more preferably not more than 97%, most preferably not more than 95%, for example not more than 90%.

The percentages (% YN) and (% NY) can be determined using NMR techniques, for example those NMR techniques as described in EP 1 702 015 A1 for determining the degree of branching.

Generally, (Y) can be of any chemical nature. (Y) is preferably an alkyl, aryl, alkylaryl, or arylalkyl group comprising at least one moiety (Z). (Y) is more preferably an alkyl, most preferably a $C_1$ to $C_{15}$ alkyl, particularly a $C_1$ to $C_5$ alkyl, for example a methyl group comprising at least one moiety (Z).

According to one embodiment, (Y) is the pendant group (Y1) comprising one moiety (Z), wherein m is an integer from 1 to 15, more preferably an integer from 1 to 5, most preferably 1.

$$(Y1) = *\!\!-\!\!\underset{m}{\diagup\!\!\diagdown}\!\!-\!\!(Z)$$

According to a further embodiment, (Y) is an N,N-dialkylaminoalkyl group comprising at least one moiety (Z), preferably an aminoalkyl group which is N,N-disubstituted with an alkyl group comprising comprising at least one moiety (Z), more preferably a $C_2$ to $C_5$ aminoalkyl group which is N,N-disubstituted with a $C_1$ to $C_5$ alkyl group comprising the moiety (Z), most preferably an aminoethyl group which is N,N-disubstituted with an methyl group comprising the moiety (Z).

According to a further embodiment, (Y) is the pendant group (Y2) comprising two moieties (Z), wherein n is an integer from 2 to 15, more preferably an integer from 2 to 5, most preferably 2, and wherein p is an integer from 1 to 15, more preferably an integer from 1 to 5, most preferably 1.

$$(Y2) = *\!\!-\!\!\underset{n}{\diagup\!\!\diagdown}\!\!-\!\!N\!\!\underset{p}{\diagdown\!\!\diagup}\!\!-\!\!(Z)$$
$$\phantom{(Y2) = *\!\!-\!\!\underset{n}{\diagup\!\!\diagdown}\!\!-\!\!N}\!\!\underset{p}{\diagdown\!\!\diagup}\!\!-\!\!(Z)$$

According to a further embodiment, (B) is a polyalkyleneimine or a salt thereof comprising pendant group (Y1) and/or (Y2), wherein
(Y1) and (Y2) are covalently bound to the nitrogen atoms on the polyalkyleneimine backbone,
m is an integer from 1 to 15,
n is an integer from 2 to 15,
p is an integer from 1 to 15,
(Z) is a carboxylic acid (—COOH), sulfonic acid (—$SO_3H$), sulfuric acid (—O—$SO_3^-$), phosphonic acid (—P(=O)$(OH)_2$), phosphoric acid (—O—P(=O)$(OH)_2$) moiety, or their deprotonated forms.

According to a further embodiment, (B) is a polyethyleneimine or a salt thereof comprising pendant group (Y1) and/or pendant group (Y2), wherein
(Y1) and (Y2) are covalently bound to the nitrogen atoms on the polyethyleneimine backbone,
m is an integer from 1 to 5,
n is an integer from 2 to 5,
p is an integer from 1 to 5,
(Z) is a carboxylic acid (—COOH) moiety or its deprotonated form.

According to a further embodiment, (B) is a salt of a polyethyleneimine comprising pendant group (Y1) and pendant group (Y2), wherein
(Y1) and (Y2) are covalently bound to the nitrogen atoms on the polyethyleneimine backbone in such a way that there is essentially a periodically alternating arrangement of (Y1)-substituted and (Y2)-substituted nitrogen atoms on the backbone,
m is an integer from 1 to 3,
n is an integer from 2 to 3,
p is an integer from 1 to 3,
(Z) is the deprotonated form of a carboxylic acid (—COOH) moiety.

Generally, each type of (Y) comprises at least one type of moieties (Z). Each type of (Y) comprises preferably 1 to 4 types, more preferably 1 or 2 types, most preferably 1 type of moieties (Z).

In general, each pendant group (Y) comprises at least one moiety (Z). Each pendant group (Y) comprises preferably 1 to 10, more preferably 1 to 4, most preferably 1 or 2 moieties (Z).

(Z) is a carboxylate (—$COOR^1$), sulfonate (—$SO_3R^2$), sulfate (—O—$SO_3R^3$), phosphonate (—P(=O)$(OR^4)$$(OR^5)$), or phosphate (—O—P(=O)$(OR^6)$$(OR^7)$), carboxylic acid (—COOH), sulfonic acid (—$SO_3H$), sulfuric acid (—O—$SO_3^-$), phosphonic acid (—P(=O)$(OH)_2$), phosphoric acid (—O—P(=O)$(OH)_2$) moiety, or their deprotonated forms, wherein
$R^1$ is alkyl, aryl, alkylaryl, or arylalkyl, and preferably alkyl,
$R^2$ is alkyl, aryl, alkylaryl, or arylalkyl, and preferably alkyl,
$R^3$ is alkyl, aryl, alkylaryl, or arylalkyl, and preferably alkyl,
$R^4$ is alkyl, aryl, alkylaryl, or arylalkyl, and preferably alkyl,
$R^5$ is H, alkyl, aryl, alkylaryl, or arylalkyl, and preferably alkyl,
$R^6$ is alkyl, aryl, alkylaryl, or arylalkyl, and preferably alkyl,
$R^7$ is H, alkyl, aryl, alkylaryl, or arylalkyl. and preferably alkyl,
$R_1$ is preferably alkyl, more preferably $C_1$ to $C_{20}$ alkyl, most preferably $C_1$ to $C_6$ alkyl. $R_2$ is preferably alkyl, more preferably $C_1$ to $C_{20}$ alkyl, most preferably $C_1$ to $C_6$ alkyl. $R_3$ is preferably alkyl, more preferably $C_1$ to $C_{20}$ alkyl, most preferably $C_1$ to $C_6$ alkyl. $R_4$ is preferably alkyl, more preferably $C_1$ to $C_{20}$ alkyl, most preferably $C_1$ to $C_6$ alkyl. $R_5$ is preferably alkyl, more preferably $C_1$ to $C_{20}$ alkyl, most preferably $C_1$ to $C_6$ alkyl. $R_6$ is preferably alkyl, more preferably $C_1$ to $C_{20}$ alkyl, most preferably $C_1$ to $C_6$ alkyl. $R_7$ is preferably alkyl, more preferably $C_1$ to $C_{20}$ alkyl, most preferably $C_1$ to $C_6$ alkyl.

Preferably, (Z) is a carboxylic acid (—COOH), sulfonic acid (—$SO_3H$), sulfuric acid (—O—$SO_3^-$), phosphonic acid (—P(=O)$(OH)_2$), phosphoric acid (—O—P(=O)$(OH)_2$) moiety, or their deprotonated forms. More preferably, (Z) is a carboxylic acid (—COOH), sulfonic acid (—$SO_3H$) moiety, or their deprotonated forms. Most preferably, (Z) is a carboxylic acid (—COOH) moiety, or its deprotonated form. For example, (Z) is the deprotonated form of a carboxylic acid (—COOH) moiety.

According to the invention, the CMP composition contains an aqueous medium (C). (C) can be of one type or a mixture of different types of aqueous media.

In general, the aqueous medium (C) can be any medium which contains water. Preferably, the aqueous medium (C) is a mixture of water and an organic solvent miscible with water (e.g. an alcohol, preferably a $C_1$ to $C_3$ alcohol, or an alkylene glycol derivative. More preferably, the aqueous medium (C) is water. Most preferably, aqueous medium (C) is de-ionized water.

If the amounts of the components other than (C) are in total x % by weight of the CMP composition, then the amount of (C) is (100-x) % by weight of the CMP composition.

The CMP composition of the invention can further optionally contain at least one corrosion inhibitor (D), for example two corrosion inhibitors. Preferred corrosion inhibitors are diazoles, triazoles, tetrazoles and their derivatives, for example benzotriazole or tolyltriazole. Other examples for preferred corrosion inhibitors are acetylene alcohols, or a salt or an adduct of an amine and a carboxylic acid comprising an amide moiety.

If present, (D) can be contained in varying amounts. Preferably, the amount of (D) is not more than 10 wt. %, more preferably not more than 5 wt. %, most preferably not more than 2.5 wt. %, for example not more than 1.5 wt. %, based on the total weight of the corresponding composition. Preferably, the amount of (D) is at least 0.01 wt. %, more preferably at least 0.1 wt. %, most preferably at least 0.3 wt. %, for example at least 0.8 wt. %, based on the total weight of the corresponding composition.

The CMP composition of the invention can further optionally contain at least one oxidizing agent (E), for example one oxidizing agent. In general, the oxidizing agent is a compound which is capable of oxidizing the to-be-polished substrate or one of its layers. Preferably, (E) is a pertype oxidizer. More preferably, (E) is a peroxide, persulfate, perchlorate, perbromate, periodate, permanganate, or a derivative thereof. Most preferably, (E) is a peroxide or persulfate. Particularly, (E) is a peroxide. For example, (E) is hydrogen peroxide.

If present, (E) can be contained in varying amounts. Preferably, the amount of (E) is not more than 20 wt. %, more preferably not more than 10 wt. %, most preferably not more than 5 wt. %, for example not more than 2 wt. %, based on the total weight of the corresponding composition. Preferably, the amount of (E) is at least 0.05 wt. %, more preferably at least 0.1 wt. %, most preferably at least 0.5 wt. %, for example at least 1 wt. %, based on the total weight of the corresponding composition.

The CMP composition of the invention can further optionally contain at least one complexing agent (F), for example one complexing agent. In general, the complexing agent is a compound which is capable of complexing the ions of the to-be-polished substrate or of one of its layers. Preferably, (F) is a carboxylic acid having at least two COOH groups, an N-containing carboxylic acid, N-containing sulfonic acid, N-containing sulfuric acid, N-containing phosphonic acid, N-containing phosphoric acid, or a salt thereof. More preferably, (F) is a carboxylic acid having at least two COOH groups, an N-containing carboxylic acid, or a salt thereof. Most preferably, (F) is an amino acid, or a salt thereof. For example, (F) is glycine, serine, alanine, hystidine, or a salt thereof. In a further embodiment, (F) is ethylenediaminetetraacetic Acid (EDTA), Nitrolotriacetic Acid (NTA), Diethylene Triaminepentaacedic Acid (DTPA), Hydroxyethylethylenediaminetriacetic Acid (HEDTA), Methylglycinediacetic Acid (MGDA) or a derivative thereof.

If present, (F) can be contained in varying amounts. Preferably, the amount of (F) is not more than 20 wt. %, more preferably not more than 10 wt. %, most preferably not more than 5 wt. %, for example not more than 2 wt. %, based on the total weight of the corresponding composition. Preferably, the amount of (F) is at least 0.05 wt. %, more preferably at least 0.1 wt. %, most preferably at least 0.5 wt. %, for example at least 1 wt. %, based on the total weight of the corresponding composition.

The properties of the CMP compositions used or according to the invention respectively, such as stability and polishing performance, may depend on the pH of the corresponding composition. Preferably, the pH value of the compositions used or according to the invention respectively is in the range of from 3 to 10, more preferably from 4.5 to 7.5, and most preferably from 5.5 to 6.5.

The CMP compositions used or according to the invention respectively may also contain, if necessary, various other additives, including but not limited to pH adjusting agents, stabilizers, surfactants etc. Said other additives are for instance those commonly employed in CMP compositions and thus known to the person skilled in the art. Such addition can for example stabilize the dispersion, or improve the polishing performance, or the selectivity between different layers.

If present, said additive can be contained in varying amounts. Preferably, the amount of said additive is not more than 10 wt. %, more preferably not more than 1 wt. %, most preferably not more than 0.1 wt. %, for example not more than 0.01 wt. %, based on the total weight of the corresponding composition. Preferably, the amount of said additive is at least 0.0001 wt. %, more preferably at least 0.001 wt. %, most preferably at least 0.01 wt. %, for example at least 0.1 wt. %, based on the total weight of the corresponding composition.

For the embodiments below, all concentration ranges or concentration specifications in wt. % (percent by weight) are based on the total weight of the corresponding composition, unless stated otherwise.

According to one embodiment, the CMP composition of the invention comprises:
- (A) inorganic particles, in a concentration of from 0.01 to 5 wt. %,
- (B) polyethyleneimine or a salt thereof in which the nitrogen atoms on its backbone are substituted with at least one type of pendant group (Y) which comprises at least one carboxylic acid (—COOH) moiety or its deprotonated form, in a concentration of from 0.0005 to 1 wt. %,
- (C) an aqueous medium,
- (D) one or more corrosion inhibitors, in a total concentration of from 0.01 to 10 wt. %,
- (E) one or more oxidizing agents, in a total concentration of from 0.1 to 10 wt. %.

According to a further embodiment, the CMP composition of the invention comprises:
- (A) inorganic particles, in a concentration of from 0.01 to 5 wt. %,
- (B) polyethyleneimine or a salt thereof in which the nitrogen atoms on its backbone are substituted with at least one type of pendant group (Y) which comprises at least one carboxylic acid (—COOH) moiety or its deprotonated form, in a concentration of from 0.0005 to 1 wt. %,
- (C) an aqueous medium,
- (D) one or more corrosion inhibitors, among which at least one is selected from the group consisting of acetylene alcohols, and
  a salt or an adduct of an amine and a carboxylic acid comprising an amide moiety
  in a total concentration of from 0.01 to 10 wt. %,
- (E) one or more oxidizing agents, in a total concentration of from 0.1 to 10 wt. %.

According to a further embodiment, the CMP composition of the invention comprises:
- (A) inorganic particles, in a concentration of from 0.01 to 5 wt. %,
- (B) polyethyleneimine or a salt thereof in which the nitrogen atoms on its backbone are substituted with at least one type of pendant group (Y) which comprises at least one carboxylic acid (—COOH) moiety or its deprotonated form, in a concentration of from 0.0005 to 1 wt. %,
- (C) an aqueous medium,
- (D) one or more corrosion inhibitors, in a total concentration of from 0.01 to 10 wt. %,
- (E) one or more oxidizing agents, in a total concentration of from 0.1 to 10 wt. %,
- (F) one or more complexing agents, in a total concentration of from 0.1 to 10 wt. %.

According to a further embodiment, the CMP composition of the invention comprises:
- (A) silica particles, in a concentration of from 0.01 to 5 wt. %,
- (B) polyethyleneimine or a salt thereof in which the nitrogen atoms on its backbone are substituted with at least one type of pendant group (Y) which comprises at least one carboxylic acid (—COOH) moiety or its deprotonated form, in a concentration of from 0.0005 to 1 wt. %,
- (C) an aqueous medium,
- (D) one or more corrosion inhibitors, among which at least one is selected from the group consisting of
  - diazoles, triazoles, tetrazoles, and their derivatives,
  - acetylene alcohols, and
  - a salt or an adduct of an amine and a carboxylic acid comprising an amide moiety,
  in a total concentration of from 0.01 to 10 wt. %,
- (E) one or more oxidizing agents, among which at least one is selected from the group consisting of
  - peroxide, persulfate, perchlorate, perbromate, periodate, permanganate,
  - or a derivative thereof,
  in a total concentration of from 0.1 to 10 wt. %,
- (F) one or more complexing agents, among which at least one is selected from the group consisting of
  - carboxylic acid having at least two COOH groups, an N-containing carboxylic acid, N-containing sulfonic acid, N-containing sulfuric acid, N-containing phosphonic acid, N-containing phosphoric acid, or a salt thereof,
  in a total concentration of from 0.1 to 10 wt. %.

According to a further embodiment, the CMP composition of the invention comprises:
- (A) silica particles, in a concentration of from 0.01 to 5 wt. %,
- (B) polyethyleneimine or a salt thereof in which the nitrogen atoms on its backbone are substituted with at least one type of pendant group (Y) which comprises at least one carboxylic acid (—COOH) moiety or its deprotonated form, in a concentration of from 0.0005 to 1 wt. %,
- (C) an aqueous medium,
- (D) one or more corrosion inhibitors, among which at least one is selected from the group consisting of
  - diazoles, triazoles, tetrazoles, and their derivatives,
  in a total concentration of from 0.01 to 10 wt. %,
- (E) one or more oxidizing agents, among which at least one is selected from the group consisting of
  - peroxide and persulfate
  in a total concentration of from 0.1 to 10 wt. %,
- (F) one or more complexing agents, among which at least one is selected from the group consisting of
  - a carboxylic acid having at least two COOH groups, an N-containing carboxylic acid, or a salt thereof,
  in a total concentration of from 0.1 to 10 wt. %.

According to a further embodiment, the CMP composition of the invention comprises:
- (A) silica particles, in a concentration of from 0.01 to 5 wt. %,
- (B) polyethyleneimine or a salt thereof in which the nitrogen atoms on its backbone are substituted with at least one type of pendant group (Y) which comprises at least one carboxylic acid (—COOH) moiety or its deprotonated form, in a concentration of from 0.0005 to 1 wt. %,
- (C) an aqueous medium,
- (D) one or more corrosion inhibitors, among which at least one is selected from the group consisting of
  - acetylene alcohols, and
  - a salt or an adduct of an amine and a carboxylic acid comprising an amide moiety
  in a total concentration of from 0.01 to 10 wt. %,
- (E) one or more oxidizing agents, among which at least one is selected from the group consisting of
  - peroxide and persulfate
  in a total concentration of from 0.1 to 10 wt. %,
- (F) one or more complexing agents, among which at least one is selected from the group consisting of
  - a carboxylic acid having at least two COOH groups, an N-containing carboxylic acid, or a salt thereof,
  in a total concentration of from 0.1 to 10 wt. %.

Processes for preparing CMP compositions are generally known. These processes may be applied to the preparation of the CMP composition of the invention. This can be carried out by dispersing or dissolving the above-described components (A) and (B) in the aqueous medium (C), preferably water, and optionally by adjusting the pH value through adding an acid, a base, a buffer or an pH adjusting agent. For this purpose the customary and standard mixing processes and mixing apparatuses such as agitated vessels, high shear impellers, ultrasonic mixers, homogenizer nozzles or counterflow mixers, can be used.

The CMP composition of the invention is preferably prepared by dispersing the particles (A), dispersing and/or dissolving a polymeric polyamine or a salt thereof (B) in the aqueous medium (C).

The polishing process is generally known and can be carried out with the processes and the equipment under the conditions customarily used for the CMP in the fabrication of wafers with integrated circuits. There is no restriction on the equipment with which the polishing process can be carried out.

As is known in the art, typical equipment for the CMP process consists of a rotating platen which is covered with a polishing pad. Also orbital polishers have been used. The wafer is mounted on a carrier or chuck. The side of the wafer being processed is facing the polishing pad (single side polishing process). A retaining ring secures the wafer in the horizontal position.

Below the carrier, the larger diameter platen is also generally horizontally positioned and presents a surface parallel to that of the wafer to be polished. The polishing pad on the platen contacts the wafer surface during the planarization process.

To produce material loss, the wafer is pressed onto the polishing pad. Both the carrier and the platen are usually caused to rotate around their respective shafts extending perpendicular from the carrier and the platen. The rotating carrier shaft may remain fixed in position relative to the rotating platen or may oscillate horizontally relative to the platen. The direction of rotation of the carrier is typically, though not necessarily, the same as that of the platen. The speeds of rotation for the carrier and the platen are generally, though not necessarily, set at different values. During the CMP process of the invention the CMP composition of the invention is usually applied onto the polishing pad as a continuous stream or in dropwise fashion. Customarily, the temperature of the platen is set at temperatures of from 10 to 70° C.

The load on the wafer can be applied by a flat plate made of steel for example, covered with a soft pad that is often called backing film. If more advanced equipment is being used a flexible membrane that is loaded with air or nitrogen pressure presses the wafer onto the pad. Such a membrane carrier is preferred for low down force processes when a hard polishing pad is used, because the down pressure distribution on the wafer is more uniform compared to that of a carrier with a hard platen design. Carriers with the option to control the pressure distribution on the wafer may also be used according to the invention. They are usually designed with a number of different chambers that can be loaded independently from each other.

For further details reference is made to WO 2004/063301 A1, in particular page 16, paragraph [0036] to page 18, paragraph [0040] in conjunction with the FIG. 2.

By way of the CMP process of the invention and/or using the CMP composition of the invention, wafers with integrated circuits comprising a metal layer can be obtained which have an excellent functionality.

The CMP composition of the invention can be used in the CMP process as ready-to-use slurry, they have a long shelf-life and show a stable particle size distribution over long time. Thus, they are easy to handle and to store. They show an excellent polishing performance, particularly with regard to material removal rate (MRR), static etch rates (SER), and selectivity. For example the combination of a high MRR, low metal-hSER, low metal-cSER, low metal-hMSER, high ratio of MRR to metal-hSER, high ratio of MRR to metal-cSER, high ratio of MRR to metal-hMSER can be obtained when a substrate comprising a copper layer is polished. Furthermore, the friction force could be minimized, and thus the erosion could be strongly reduced when a substrate comprising a copper layer is polished. Since the amounts of its components are held down to a minimum, the CMP composition according to the invention respectively can be used in a cost-effective way, and can be prepared in a concentrated version (e.g., 10×) which can later be diluted to the proper concentration at the polishing site to reduce distribution costs.

EXAMPLES AND COMPARATIVE EXAMPLES

Analytical methods
The pH value is measured with a pH electrode (Schott, blue line, pH 0-14/−5 . . . 100° C./3 mol/L sodium chloride).
The metal-hSER (hot static etching rate of metal-containing substrate) is determined by dipping 1×1 inch [=2.54×2.54 cm] metal coupon into the corresponding composition for 5 minutes at 60° C. and measuring the loss of mass before and after the dipping.
The metal-cSER (cold static etching rate of metal-containing substrate) is determined by dipping 1×1 inch [=2.54× 2.54 cm] metal coupon into the corresponding composition for 5 minutes at 25° C. and measuring the loss of mass before and after the dipping.

The metal-hMSER (hot metal ion static etching rate with regard to metal-containing substrate) is determined by dipping 1×1 inch [=2.54×2.54 cm] metal coupon into the corresponding composition for 5 minutes at 60° C. and measuring the loss of mass before and after the dipping, after adding 500 ppm of metal salt, for example metal nitrate, to imitate the metal ions released in the polishing process.

Cu-cSER (cold static etching rate of a copper layer) is determined by dipping 1×1 inch [=2.54×2.54 cm] copper coupon into the corresponding composition for 5 minutes at 25° C. and measuring the loss of mass before and after the dipping.

Cu-hSER (hot static etching rate of a copper layer) is determined by dipping 1×1 inch [=2.54×2.54 cm] copper coupon into the corresponding composition for 5 minutes at 60° C. and measuring the loss of mass before and after the dipping.

Cu-hCSER (hot copper ion static etching rate with regard to a copper layer) is determined by dipping 1×1 inch [=2.54×2.54 cm] copper coupon into the corresponding composition for 5 minutes at 60° C. and measuring the loss of mass before and after the dipping, after adding 500 ppm of $Cu(NO_3)_2$ to imitate the copper ions released in the polishing process.

The friction force is defined as the coefficient of friction which is the ratio of friction to normal force. Friction (kgf) is determined using a GnP polisher POLI-500AC with the parameters DF: 2.5 psi [=17237 Pa], Table speed: 115 rpm; Head speed: 112 rpm by doing 60 sec wafer polishing. The normal force is determined by multiplying the stress related to the contact area with the area of the contact area of an 8" copper wafer. For calculation, the DF 2.5 psi [=17237 Pa] is converted to 0.175 Kgf/cm$^2$ and 8" wafer area is converted to 324 cm$^2$.

Particles (A)
Silica particles used as particles (A) are of NexSil™ (Nyacol) type. NexSil™ 85K are potassium-stabilized colloidal silica having a typical particle size of 50 nm and a typical surface area of 55 m$^2$/g.

Synthesis Example 1

Synthesis Example 1 is Trilon® P which is commercially available from BASF SE. Trilon® P has a molecular weight of 50,000, a degree of substitution of 80% and a negative charge density. Trilon® P is a carboxy-methylated polyethyleneimine which is represented by the below formula:

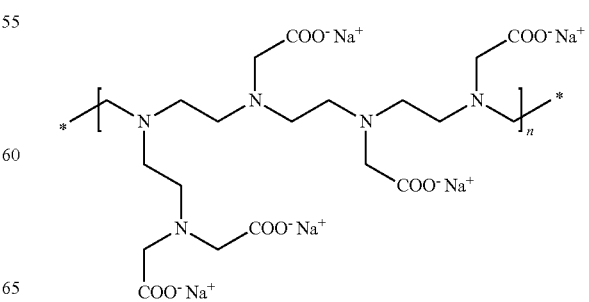

General Procedure for the CMP Experiments

First trends of formulations were evaluated on 2 inch [=5.08 cm] copper level using Buhler table polishers. For further evaluation and confirmation a 200 mm Strasbaugh 6 EC polisher was used.

For the evaluation on benchtop following parameters were chosen:

Powerpro 5000 Buhler. DF=40 N, Table speed 150 rpm, Platen speed 150 rpm, slurry flow 200 ml/min, 20 s conditioning, 1 min polishing time, IC1000 pad, diamond conditioner (3M).

The pad is conditioned by several sweeps, before a new type of CMP composition is used for CMP. For the determination of removal rates at least 3 wafers are polished and the data obtained from these experiments are averaged.

The CMP composition is stirred in the local supply station.

The copper material removal rates (Cu-MRR) for 2 inch [=5.08 cm] discs polished by the CMP composition are determined by difference of weight of the coated wafers or copper blanket discs before and after CMP, using a Sartorius LA310 S scale. The difference of weight can be converted into the difference of film thickness since the density (8.94 g/cm$^3$ for copper) and the surface area of the polished material are known. Dividing the difference of film thickness by the polishing time provides the values of the material removal rate.

For polishing on Strasbaugh 6EC following parameters were chosen:

P1 process condition:

DF=2.5 psi [=17237 Pa], Back pressure zone1=2 psi [=13790 Pa], Back pressure zone2=2 psi [=13790 Pa], Ring pressure=0.5 psi [=3447 Pa], Platen speed=85 rpm, Carrier speed=75 rpm, Slurry flow 200/min, 60 sec polishing time, IC1010 pad, Diamond conditioner (conditioning pressure: 5 lbs [=2.27 kg])

P2 process condition:

DF=1.5 psi [=10342 Pa], Back pressure zone1=2 psi [=13790 Pa], Back pressure zone2=2 psi [=13790 Pa], Ring pressure=0.5 psi [=3447 Pa], Platen speed=85 rpm, Carrier speed=75 rpm, Slurry flow 200/min, 60 sec polishing time, IC1010 pad, Diamond conditioner (conditioning pressure: 5 lbs [=2.27 kg])

Objective to be polished: copper blanket wafer (8 inch [=20.32 cm] silicon wafer having a copper layer formed by electrolytic plating), copper patterned wafer (854 mask pattern, manufactured by SKW Associates, Inc.)

Evaluation of the stock removal rate was carried out by means of a 8 inch [=20.32 cm] blanket wafer. After 60 sec polishing, the layer thickness before and after the polishing of the object to be polished, was measure by means of a sheet resistance meter (Resmap 273, manufactured by Creative Design Engineering, Inc.).

Dishing and erosion are determined as follows: Evaluation of recesses on the copper wiring (dishing) or dielectric isolate (erosion) was carried out by means of a copper patterned wafer. Polishing was carried out until copper at the area portion was completed polished and removed, and the height difference between the copper wiring portion and the barrier layer, as well as the height difference between dielectric isolate and the barrier layer on field dielectric, were measured by means of a profiler (Ambios XP2, manufactured by Ambios Technology, Inc., part of KLA Tencole Company) which is a contact type surface measuring apparatus.

Example 1-9 (Compositions of the Invention) and Comparative Examples V1-V6 (Comparative Compositions)

An aqueous dispersion containing the components as listed in Table 1 was prepared, furnishing the CMP compositions of the examples 1-9 and the comparative examples V1-V6. For all these examples, the pH was adjusted to 6 with HNO$_3$ if the pH was too high or KOH if the starting pH was too low.

Data for the polishing performance of the CMP compositions of the examples 1 to 9 and of the comparative examples V1-V6 are given in the Table 1:

TABLE 1

Compositions of the examples 1 to 9 and of the comparative examples V1 to V6, their pH values and Cu-cSER, Cu-hSER, Cu-hCSER data as well as their material removal rates (MRR) and erosion data in the copper CMP process using these compositions, wherein the aqueous medium (C) is de-ionized water (MRR measured on 2 inch [=5.08 cm] copper discs with Powerpro 5000 Bühler polisher, erosion measured on 8 inch [=20.32 cm] copper discs with Strasbaugh 6EC polisher)

| | Example 1 | Comparative Example V1 | Example 2 | Example 3 | Example 4 |
|---|---|---|---|---|---|
| Particles (A) | NexSil ™ 85K 0.2 wt. % | NexSil ™ 85K 0.2 wt. % | NexSil ™ 85K 0.2 wt. % | NexSil ™ 85K 0.2 wt. % | NexSil ™ 85K 0.2 wt. % |
| Polymeric Polyamine (B) | Synthesis Example 1 0.5 wt. % | — | Synthesis Example 1 0.5 wt. % | Synthesis Example 1 0.5 wt. % | Synthesis Example 1 0.5 wt. % |
| Corrosion inhibitor (D) | — | — | — | Tolyltriazole 0.0033 wt. % | Tolyltriazole 0.013 wt. % |
| Further corrosion inhibitor (D) | — | — | — | — | — |
| Oxidizing agent (E) | H$_2$O$_2$ 1 wt. % | H$_2$O$_2$ 1 wt. % | H$_2$O$_2$ 1 wt. % | H$_2$O$_2$ 1 wt. % | H$_2$O$_2$ 1 wt. % |
| Complexing agent (F) | — | Glycine 0.5 wt. % | Glycine 0.5 wt. % | Glycine 0.5 wt. % | Serine 1 wt. % |
| pH | 6 | 6 | 6 | 6 | 6 |
| Cu-MRR in Å/min | 340 | 6319 | 4538 | 6043 | 5005 |
| Cu-cSER in Å/min | 20 | 396 | 414 | 96 | 70 |

TABLE 1-continued

Compositions of the examples 1 to 9 and of the comparative examples V1 to V6, their pH values and Cu-cSER, Cu-hSER, Cu-hCSER data as well as their material removal rates (MRR) and erosion data in the copper CMP process using these compositions, wherein the aqueous medium (C) is de-ionized water (MRR measured on 2 inch [=5.08 cm] copper discs with Powerpro 5000 Bühler polisher, erosion measured on 8 inch [=20.32 cm] copper discs with Strasbaugh 6EC polisher)

| | | | | | |
|---|---|---|---|---|---|
| Cu-hSER in Å/min | 55 | 1765 | 551 | 228 | 296 |
| Cu-hCSER in Å/min | 35 | 3958 | 1334 | 729 | 654 |
| Ratio MRR to Cu-hCSER | 9.7 | 1.6 | 3.4 | 8.3 | 7.7 |

| | Example 5 | Comparative Example V2 | Comparative Example V3 | Comparative Example V4 | Comparative Example V5 |
|---|---|---|---|---|---|
| Particles (A) | NexSil ™ 85K 0.2 wt. % | NexSil ™ 85K 0.2 wt. % | NexSil ™ 85K 0.2 wt. % | NexSil ™ 85K 0.2 wt. % | NexSil ™ 85K 0.2 wt. % |
| Polymeric Polyamine (B) | Synthesis Example 1 0.5 wt. % | — | — | — | — |
| Corrosion inhibitor (D) | Tolyltriazole 0.013 wt. % | Tolyltriazole 0.013 wt. % | Tolyltriazole 0.013 wt. % | Tolyltriazole 0.013 wt. % | Tolyltriazole 0.013 wt. % |
| Further corrosion inhibitor (D) | 2-(prop-2-ynyloxy)-propanol 0.02 wt. % | 2-(prop-2-ynyloxy)-propanol 0.02 wt. % | 2-(prop-2-ynyloxy)-propanol 0.02 wt. % | 2-(prop-2-ynyloxy)-propanol 0.02 wt. % | 2-(prop-2-ynyloxy)-propanol 0.02 wt. % |
| Oxidizing agent (E) | $H_2O_2$ 1 wt. % | $H_2O_2$ 1 wt. % | $H_2O_2$ 1 wt. % | $H_2O_2$ 1 wt. % | $H_2O_2$ 1 wt. % |
| Complexing agent (F) | — | — | Glycine 0.5 wt. % | Methyl-glycine-diacetic acid 0.1 wt. % | Ethylene-diamine-tetraacetic acid (EDTA) 0.5 wt. % |
| pH | 6 | 6 | 6 | 6 | 6 |
| Cu-MRR in Å/min | 1866 | 233 | 3564 | 175 | 2283 |
| Cu-cSER in Å/min | −21 | −7 | 83 | 23 | 202 |
| Cu-hSER in Å/min | 16 | −16 | 257 | 6 | 116 |
| Cu-hCSER in Å/min | 87 | 1 | 544 | 278 | 314 |
| Ratio MRR to Cu-hCSER | 21.4 | 233.0 | 6.6 | 0.6 | 7.3 |

| | Comparative Example V6 | Example 6 | Example 7 | Example 8 | Example 9 |
|---|---|---|---|---|---|
| Particles (A) | NexSil ™ 85K 0.1 wt. % | NexSil ™ 85K 0.1 wt. % | NexSil ™ 85K 0.1 wt. % | NexSil ™ 85K 0.1 wt. % | NexSil ™ 85K 0.1 wt. % |
| Polymeric Polyamine (B) | — | Synthesis Example 1 0.05 wt. % | Synthesis Example 1 0.1 wt. % | Synthesis Example 1 0.5 wt. % | Synthesis Example 1 1 wt. % |
| Corrosion inhibitor (D) | 1,2,4-Triazole 0.2 wt. % | 1,2,4-Triazole 0.2 wt. % | 1,2,4-Triazole 0.2 wt. % | 1,2,4-Triazole 0.2 wt. % | 1,2,4-Triazole 0.2 wt. % |
| Further corrosion inhibitor (D) | 2-(prop-2-ynyloxy)-propanol 1.5 wt. % | 2-(prop-2-ynyloxy)-propanol 1.5 wt. % | 2-(prop-2-ynyloxy)-propanol 1.5 wt. % | 2-(prop-2-ynyloxy)-propanol 1.5 wt. % | 2-(prop-2-ynyloxy)-propanol 1.5 wt. % |
| Oxidizing agent (E) | $H_2O_2$ 1 wt. % | $H_2O_2$ 1 wt. % | $H_2O_2$ 1 wt. % | $H_2O_2$ 1 wt. % | $H_2O_2$ 1 wt. % |
| Complexing agent (F) | Serine 1.3 wt. % | Serine 1.3 wt. % | Serine 1.3 wt. % | Serine 1.3 wt. % | Serine 1.3 wt. % |
| pH | 6.5 | 6.5 | 6.5 | 6.5 | 6.5 |
| Cu-MRR in Å/min | 5200 | 5100 | 5300 | 2800 | 3000 |
| cSER in Å/min | — | — | — | — | — |
| hSER in Å/min | 102 | 69 | 49 | 26 | 29 |
| Cu-hCSER in Å/min | — | — | — | — | — |
| Erosion in Å | approx. 500 (overpolishing <20 sec.) | — | approx. 125 (overpolishing <15 sec.) | — | — |

TABLE 1-continued

Compositions of the examples 1 to 9 and of the comparative examples V1 to V6, their
pH values and Cu-cSER, Cu-hSER, Cu-hCSER data as well as their material removal rates
(MRR) and erosion data in the copper CMP process using these compositions, wherein the
aqueous medium (C) is de-ionized water (MRR measured on 2 inch [=5.08 cm] copper discs
with Powerpro 5000 Bühler polisher, erosion measured on 8 inch [=20.32 cm] copper discs with
Strasbaugh 6EC polisher)

| Erosion in Å | approx. 950 (overpolishing <40 sec.) | — | approx. 175 (overpolishing <35 sec.) | — | — |

These examples of the CMP compositions of the invention improve the polishing performance.

FIG. 1 shows the reduction of friction force during polishing an 8" copper wafer (measured on GnP polisher POLI-500AC):

y1=coefficient of friction,
x1=polishing time in seconds

The bold line in FIG. 1 represents Example 6.
The line dotted with small dots in FIG. 1 represents Example 7.
The dashed line in FIG. 1 represents Comparative Example V6.

The invention claimed is:

1. A CMP composition, comprising:
   (A) inorganic particles, organic particles, or a composite or mixture thereof;
   (B) a polyethyleneimine or a salt thereof comprising a pendant group (Y2) or both

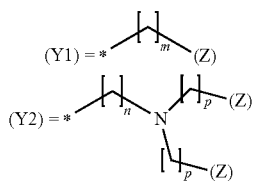

pendant groups (Y1) and (Y2):
   wherein
   (Y1) is covalently bound to a nitrogen atom on the polyethyleneimine backbone,
   (Y2) is covalently bound to a nitrogen atom on the polyethyleneimine backbone,
   m is an integer from 1 to 5,
   n is an integer from 2 to 5,
   p is an integer from 1 to 5, and
   (Z) is a carboxylic acid (—COOH) moiety or its deprotonated form;
   (C) an aqueous medium; and
   (D) at least one corrosion inhibitor selected from the group consisting of a diazole, a triazole, a tetrazole, a diazole derivative, a triazole derivative, a tetrazole derivative, an acetylene alcohol, and a salt or an adduct of an amine and a carboxylic acid comprising an amide moiety.

2. The CMP composition of claim 1, wherein the particles (A) comprise at least one substance selected from the group consisting of alumina, ceria, silica, titania, and zirconia.

3. The CMP composition of claim 1, further comprising an oxidizing agent.

4. The CMP composition of claim 1, wherein
   (A) is silica particles, in a concentration of 0.01 to 5 wt. % based on a total weight of the composition,
   (B) is in a concentration of 0.0005 to 1 wt. % based on the total weight of the composition,
   (D) is in a total concentration of 0.1 to 5 wt. % based on the total weight of the composition, and
   the CMP composition further comprises:
   (E) one or more oxidizing agents, in a total concentration of 0.1 to 10 wt. % based on the total weight of the composition.

5. A process for manufacturing a semiconductor device, the process comprising
   chemical-mechanical polishing a metal-comprising substrate in the presence of the CMP composition of claim 1.

6. A process for polishing a substrate, the process comprising
   polishing the substrate in the presence of the CMP composition of claim 1.

7. The CMP composition of claim 1, comprising the inorganic particles.

8. The CMP composition of claim 1, comprising the organic particles.

9. The CMP composition of claim 1, comprising a composite or mixture of the inorganic particles and the organic particles.

10. The CMP composition of claim 1, wherein (A) is present in a concentration of 0.005 to 10 wt. % based on a total weight of the composition.

11. The CMP composition of claim 1, wherein (B) is present in a concentration of 0.0001 to 4 wt. % based on a total weight of the composition.

12. The CMP composition of claim 1, wherein (B) has a weight average molecular weight of from 1,000 to 600,000 as determined by standard gel permeation chromatography.

* * * * *

UNITED STATES PATENT AND TRADEMARK OFFICE
CERTIFICATE OF CORRECTION

PATENT NO. : 10,407,594 B2
APPLICATION NO. : 14/004689
DATED : September 10, 2019
INVENTOR(S) : Bastian Marten Noller et al.

Page 1 of 1

It is certified that error appears in the above-identified patent and that said Letters Patent is hereby corrected as shown below:

In the Specification

Column 5, Line 4, "poylacrylates," should read -- polyacrylates, --.

Column 9, Lines 57-58, "Diethylene Triaminepentaacedic" should read
-- DiethyleneTriaminepentaacedic --.

Signed and Sealed this
Seventeenth Day of March, 2020

Andrei Iancu
*Director of the United States Patent and Trademark Office*